(12) United States Patent
Lee

(10) Patent No.: US 7,902,593 B2
(45) Date of Patent: Mar. 8, 2011

(54) MEMORY DEVICE AND METHOD OF MANUFACTURING THE SAME

(75) Inventor: Wook-Hyoung Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1105 days.

(21) Appl. No.: 11/645,560

(22) Filed: Dec. 27, 2006

(65) Prior Publication Data

US 2008/0076218 A1 Mar. 27, 2008

(30) Foreign Application Priority Data

Sep. 26, 2006 (KR) .................. 10-2006-0093197

(51) Int. Cl.
*H01L 29/792* (2006.01)
(52) U.S. Cl. .................. 257/326; 257/314; 438/257
(58) Field of Classification Search .................. 257/313, 257/316, 335, 404, 336; 438/256, 258
See application file for complete search history.

(56) References Cited

U.S. PATENT DOCUMENTS

| | | | |
|---|---|---|---|
| 4,500,899 A | | 2/1985 | Shirai et al. |
| 5,120,671 A | | 6/1992 | Tang et al. |
| 5,824,583 A | * | 10/1998 | Asano et al. .................. 438/258 |
| 5,912,488 A | * | 6/1999 | Kim et al. .................. 257/316 |
| 6,038,170 A | * | 3/2000 | Shiba .................. 365/185.13 |
| 6,214,666 B1 | * | 4/2001 | Mehta .................. 438/257 |
| 6,380,032 B1 | * | 4/2002 | Lee et al. .................. 438/257 |
| 7,221,588 B2 | * | 5/2007 | Fasoli et al. .................. 365/185.17 |
| 7,384,845 B2 | * | 6/2008 | Lee .................. 438/258 |

FOREIGN PATENT DOCUMENTS

| | | |
|---|---|---|
| JP | 11-031800 | 2/1999 |
| JP | 2006-054283 | 2/2006 |
| KR | 100255147 B1 | 2/2000 |
| KR | 0546299 | 1/2006 |

* cited by examiner

*Primary Examiner* — Andy Huynh
*Assistant Examiner* — David Goodwin
(74) *Attorney, Agent, or Firm* — Harness, Dickey & Pierce, P.L.C.

(57) ABSTRACT

In a memory device and a method of manufacturing the memory device, a source contact connected to a common source line may be formed on a drain region instead of a source region. A transistor having a negative threshold voltage may be formed between the source region and the drain region. A channel of the transistor may be formed. Because the source contact is formed on the drain region, the size of the source region may be reduced. An integration degree of the memory device may be improved. A control gate may linearly extend in a second direction because the source contact is not formed on the source region.

9 Claims, 11 Drawing Sheets

MEMORY DEVICE AND METHOD OF MANUFACTURING THE SAME

PRIORITY STATEMENT

This application claims priority under 35 U.S.C. §119 to Korean Patent Application No. 10-2006-0093197, filed on Sep. 26, 2006, in the Korean Intellectual Property Office (KIPO), the entire contents of which are incorporated herein by reference.

BACKGROUND

1. Field

Example embodiments relate to a memory device and a method of manufacturing the memory device. Other example embodiments relate to a memory device retaining its data even when no power is being supplied and a method of manufacturing the memory device.

2. Description of the Related Art

FIG. 1 is a plan view illustrating a conventional memory device. Referring to FIG. 1, a common source line 1 may be formed to electrically connect a plurality of source regions 2. A source contact 3 may be formed between the source regions 2. Because the source contact 3 is formed between the source regions 2, a control gate 4 having a curved shape may be employed to obtain a spacer (not shown) where the source contact 3 is formed.

As illustrated in FIG. 1, reducing the size of a source region 2 may be difficult. The source contact 3 may be formed between the source regions 2. A coupling effect due to an asymmetry may be generated between the control gates 4 having the curved shapes.

To overcome the above problems, a method of forming a depletion transistor has been invented. N-typed impurities may be implanted into a surface portion of the channel region to form the depletion transistor. An additional photolithography process for forming an ion implantation mask may be required for forming the depletion transistor.

SUMMARY

Example embodiments provide a memory device capable of overcoming the above problems. Example embodiments provide a method of manufacturing the above memory device.

In accordance with example embodiments, a memory device may include a first transistor, a second transistor, a common source, a drain contact and a source contact. The first transistor may include a first source region, a first drain region and a first channel region formed between the first source region and the first drain region. The first channel region may be doped with a P-typed impurity having a first concentration.

The second transistor may include a second source region, a second drain region and a second channel region between the second source region and the second drain region. The second channel region may be doped with a P-typed impurity having a second concentration. The second concentration may be substantially lower than the first concentration. The common source may extend in a first direction to be electrically connected to the first source region and the second source region. The drain contact may be formed on the first drain region. The source contact may be formed on the second drain region.

The first transistor may include a tunnel oxide layer on the first channel region, a floating gate on the tunnel oxide layer, an oxide/nitride/oxide (ONO) layer pattern extending in the first direction on the floating gate, and a control gate extending in the first direction on the ONO layer pattern. The second transistor may include a tunnel oxide layer on the second channel region, a floating gate on the tunnel oxide layer, an ONO layer pattern extending in the first direction on the floating gate, and a control gate extending in the first direction on the ONO layer pattern.

The first source region, the first channel region and the first drain region may be formed at an upper portion of a second P-typed impurity region extending in a second direction substantially perpendicular to the first direction. The second source region, the second channel region and the second drain region may be formed at an upper portion of a first P-typed impurity region extending in the second direction. The first P-typed impurity region may have the same P-typed impurity concentration as the second P-typed impurity region. The first channel region may correspond to a third P-typed impurity region formed at a surface portion of the second P-typed impurity region. A concentration of the P-typed impurity of the third P-typed impurity region may be higher than that of the second channel region. The second channel region may correspond to a surface portion of the first P-typed impurity region.

The second concentration of the second channel region may be about 25% to about 50% of the first concentration of the first channel region. Threshold voltages of the first transistor and the second transistor may be positive and negative, respectively. The first source region, the second source region, the first drain region and the second drain region may be doped with an N-typed impurity. The source contact and the drain contact may be linearly arranged in the first direction.

In accordance with example embodiments, there is provided a method of manufacturing a memory device. In the method, a first P-typed impurity region and a second P-typed impurity region having a first P-typed impurity concentration may be formed by implanting P-typed impurities into an upper portion of the semiconductor substrate. The P-typed impurities may be selectively implanted into a surface portion of the second P-typed impurity region to selectively form a third P-typed impurity region having a second concentration substantially larger than the first concentration at the surface portion of the second P-typed impurity region. A floating gate, an ONO layer pattern and a control gate may be subsequently formed on the first P-typed impurity region and the third P-typed impurity region. N-typed impurities may be implanted into the first P-typed impurity region and the third P-typed impurity region to form a first source region, a first drain region, a second source region and a second drain region. The first source region and the first drain region may be formed at the second P-typed impurity region below both sides of the floating gate. The second source region and the second drain region may be formed at the first P-typed impurity region below both sides of the floating gate. A drain contact may be formed on the first drain region. A source contact may be formed on the second drain region.

The P-typed impurity used for forming the first P-typed impurity region and the second P-typed impurity region may include boron. The P-typed impurity may be doped when applied with a voltage of about 20 Kev to about 300 Kev for forming the first P-typed impurity region and the second P-typed impurity region. A dose amount of the P-typed impurity required for forming the first P-typed impurity region and the second P-typed impurity region may be about $5\times10^{12}$ ions/$Cm^2$ to about $5\times10^{14}$ ions/$Cm^2$.

The P-typed impurity used for forming the third P-typed impurity region may include boron. The P-typed impurity may be doped when applied with a voltage of about 10 Kev to about 20 Kev for forming the third P-typed impurity region. A dose amount of the P-typed impurity required for forming the third P-typed impurity region may be about $5 \times 10^{12}$ ions/$Cm^2$ to about $5 \times 10^{14}$ ions/$Cm^2$. The first source region and the second source region may be electrically connected to a common source line that extends linearly. The method of manufacturing the memory device may further comprise removing electrons stored in the floating gate. The control gate may linearly extend in a second direction, and the source contact and the drain contact may be linearly arranged.

According to example embodiments, a source contact may be formed at a drain region instead of a common source line so that an integration degree of a memory device may be efficiently improved. A control gate may be linearly formed in a second direction, to thereby effectively prevent or reduce a deterioration of an operation characteristic due to a coupling effect generated between curved control gates. Furthermore, a memory device of example embodiments may not employ a depletion transistor. An additional photolithography process and an additional ion implantation process required for forming the depletion transistor may not be required, and thus processes may be simplified.

BRIEF DESCRIPTION OF THE DRAWINGS

Example embodiments will be more clearly understood from the following detailed description taken in conjunction with the accompanying drawings.

FIG. 1 is a plan view illustrating a conventional memory device;

FIG. 2 is a partially cut perspective view illustrating a memory device in accordance with example embodiments;

FIG. 3 is a cross-sectional view taken along a line I-I' in FIG. 2;

FIG. 4 is a cross-sectional view illustrating a line II-II' in FIG. 2;

FIG. 5 is a graph showing a variation of a threshold voltage $V_{th}$ with respect to FN erase times of the first transistor 134 and the second transistor 136;

FIG. 6 is a plan view illustrating a source contact and a drain contact formed at a resultant in FIG. 2;

FIGS. 7 to 19 are partially cut perspective views illustrating a method of manufacturing the memory device in FIG. 3;

FIG. 20 is a cross-sectional view taken along a line I-I' in FIG. 19;

FIG. 21 is a cross-sectional view taken along a line II-II' in FIG. 19; and

FIG. 22 is plan view illustrating a formation of a source contact and a drain contact on a resultant in FIG. 19.

DESCRIPTION OF EXAMPLE EMBODIMENTS

Figure 1:
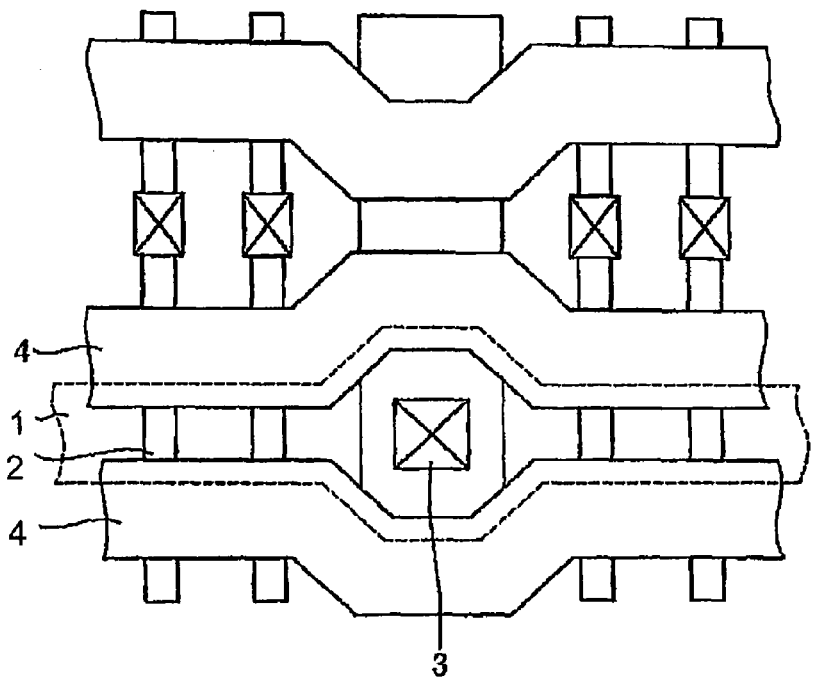
FIGS. 1-22 represent non-limiting, example embodiments as described herein.

Example embodiments will be described with reference to the accompanying drawings. Example embodiments may, however, be embodied in many different forms and should not be construed as limited to the embodiments set forth herein. Rather, the embodiments are provided so that disclosure of example embodiments will be thorough and complete, and will fully convey the scope of example embodiments to those skilled in the art. The principles and features of example embodiments may be employed in varied and numerous embodiments without departing from the scope of example embodiments. In the drawings, the size and relative sizes of layers and regions may be exaggerated for clarity. The drawings are not necessarily to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of example embodiments.

Spatially relative terms, such as "beneath," "below," "lower," "above," "upper" and the like may be used to describe an element and/or feature's relationship to another element s and/or feature s as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented e.g., rotated 90 degrees or at other orientations and the spatially relative descriptors used herein interpreted accordingly.

The terminology used herein is for the purpose of describing particular embodiments only and is not intended to be limiting of example embodiments. As used herein, the singular terms "a," "an" and "the" are intended to include the plural forms as well, unless the context clearly indicates otherwise. It will be further understood that the terms "includes" and/or "including" , when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms including technical and scientific terms used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Example embodiments are described with reference to cross-sectional illustrations that are schematic illustrations of idealized, example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of example embodiments.

Figure 2:
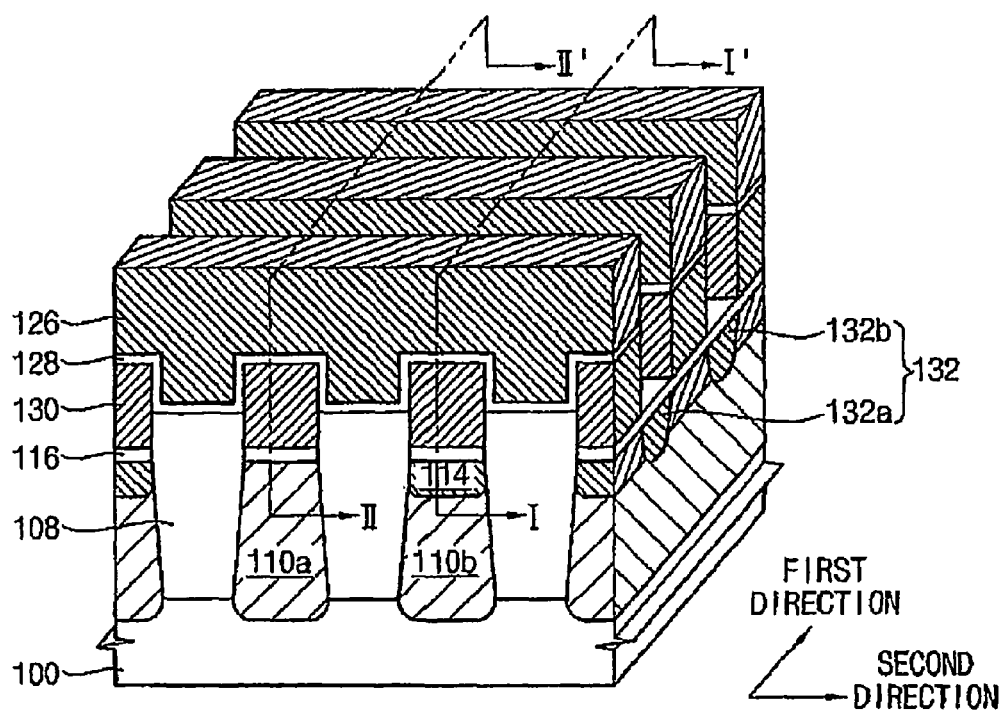

FIG. 2 is a partially cut perspective view illustrating a memory device in accordance with example embodiments. Although FIG. 2 illustrates a non-volatile memory device, advantages of example embodiments may be employed in a volatile memory device, e.g., a DRAM device and/or an SRAM device.

Referring to FIG. 2, a first P-typed impurity region 110a and a second P-typed impurity region 110b that extend in a first direction may be formed at an upper portion of a semiconductor substrate 100. The semiconductor substrate 100 may be doped with P-typed (positive typed) impurities, providing holes before an ion implantation process required for forming the first P-typed impurity region 110a and the second P-typed impurity region 110b is performed. The P-typed impurities may be boron (B), aluminum (Al), gallium (Ga) and/or indium (In). These may be used alone and/or in a combination thereof.

The first P-typed impurity region 110a and the second P-typed impurity region 110b may be formed by additionally implanting the P-typed impurities. A concentration of the P-typed impurity in the first P-typed impurity region 110a and the second P-typed impurity region 110b may be substantially larger than a concentration of the P-typed impurity in a lower portion of the semiconductor substrate 100. An isolation layer 108 extending in the first direction may be formed between the first P-typed impurity region 110a and the second P-typed impurity region 110b, and between the second P-typed impurity regions 110b.

A third P-typed impurity region 114 may be formed at a surface portion of the second P-typed impurity region 110b. The third P-typed impurity region 114 may be formed by additionally doping the P-typed impurities into the second P-typed impurity region 110b. A concentration of the P-typed impurity in the third P-typed impurity region 114 may be substantially larger than that of the P-typed impurity in the second P-typed impurity region 110b. The P-typed impurities may not be additionally doped into a surface portion of the first P-typed impurity region 110a. The third P-typed impurity region 114 may not be formed at the surface portion of the first P-typed impurity region 110a.

The first P-typed impurity region 110a and the second P-typed impurity region 110b may be formed by the same ion implantation process. The first P-typed impurity region 110a and the second P-typed impurity region 110b may have substantially the same P-typed impurity concentration. A P-typed impurity concentration of the third P-typed impurity region 114 may be substantially larger than those of the first P-typed impurity region 110b and the second P-typed impurity region 110b because the third P-typed impurity region 114 may be formed at the surface portion of the second P-typed impurity region 110b by an additional ion implantation process.

When the P-typed impurity concentration of the first P-typed impurity region 110a is below about 25% of the P-typed impurity concentration of the third P-typed impurity region 114, the semiconductor substrate 100 may be damaged when the third P-typed impurity region 114 is formed. When the P-typed impurity concentration of the first P-typed impurity region 110a is above about 50% of the P-typed impurity concentration of the third P-typed impurity region 114, the third P-typed impurity region 114 may not efficiently control a threshold voltage. The P-typed impurity concentration of the first P-typed impurity region 110a may be about 25% to about 50% of the P-typed impurity concentration of the third P-typed impurity region 114.

A tunnel oxide layer 116 extending in the first direction may be formed on the first P-typed impurity region 110a and third P-typed impurity region 114. Floating gates 130 may be formed on the tunnel oxide layer 116. The floating gates 130 may be spaced apart from one another in the first direction and a second direction substantially perpendicular to the first direction. The floating gate 130 may be formed using a conductive material, e.g., doped polysilicon. An upper face of the isolation layer 108 may be substantially higher than an upper face of the tunnel oxide layer 116 and substantially lower than an upper face of the floating gate 130.

An ONO layer pattern 128 extending in the second direction may be formed on the floating gate 130 and the isolation layer 108. A control gate 126 may be formed on the ONO layer pattern 128. The control gate 126 may be formed using a conductive material, e.g., doped polysilicon. The control gate 126 may linearly extend in the second direction. An N-typed impurity region 132 may be formed below both sides of the floating gate 130 and under the tunnel oxide layer 116. The N-typed impurity region 132 may be formed by doping an N-typed impurity providing an electron. The N-typed impurity may be phosphorus (P), arsenic (As) and/or antimony (Sb). These may be used alone and/or in a combination thereof.

The N-typed impurity region 132 may include a source region 132a formed below one side of the floating gate 130 and a drain region 132b formed below the other side of the floating gate 130. The source regions 132a and the drain regions 132b may be arranged in the second direction. The source region 132a and the drain region 132b may be alternately arranged in the first direction.

Figure 3:
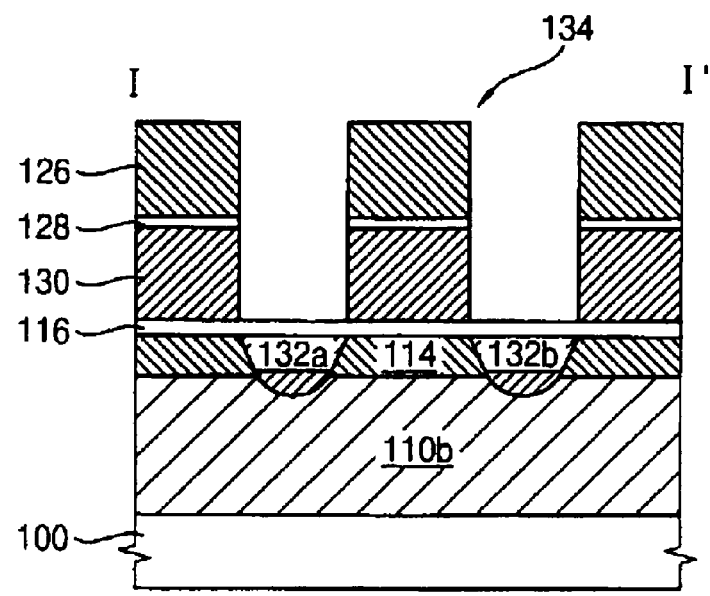

FIG. 3 is a cross-sectional view taken along a line I-I' in FIG. 2. Referring To FIG. 3, a first transistor 134 may be provided. The first transistor 134 may include the third P-typed impurity region 114 formed at an upper portion of the second P-typed impurity region 110b, which is formed on the semiconductor substrate 100, the source region 132a formed at one side of the third P-typed impurity region 114, the drain region 132b formed at the other side of the third P-typed impurity region 114, the tunnel oxide layer 116 formed on the third P-typed impurity region 114, the floating gate 130 formed on the tunnel oxide layer 116, an ONO layer pattern 128 formed on the floating gate 130 and a control gate 126 formed on the ONO layer pattern 128.

Figure 4:
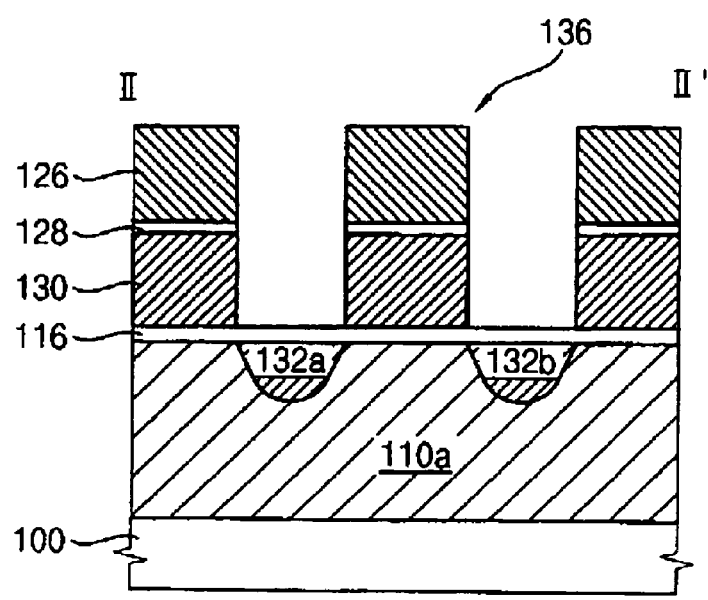

FIG. 4 is a cross-sectional view illustrating a line II-II' in FIG. 2. Referring to FIG. 4, a second transistor 136 may be provided. The second transistor 136 may be similar to the first transistor 134 except that the third P-typed impurity region 114 may not be formed below the floating gate 130. The second transistor 136 may include the source region 132a; the drain region 132b; a surface portion of the P-typed impurity region 110a located between the source region 132a and the drain region 132b; the tunnel oxide layer 116 formed on the surface portion of the first P-typed impurity region 110a; the floating gate 130 formed on the tunnel oxide layer; the ONO layer pattern 128 formed on the floating gate 130; and the control gate 126 formed on the ONO layer pattern 128.

Figure 5:
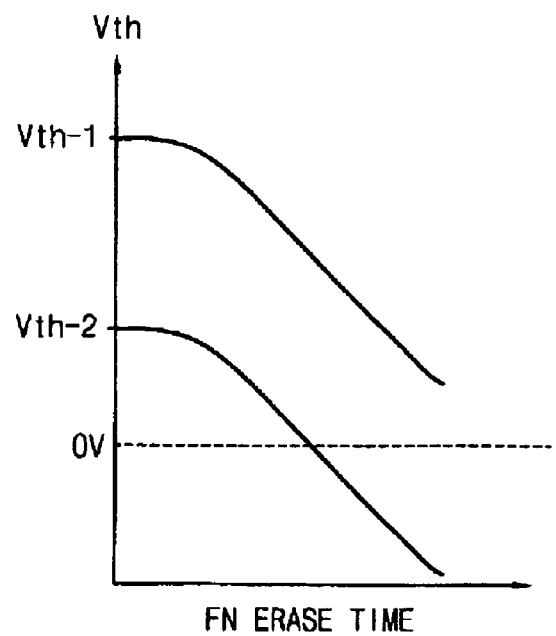

FIG. 5 is a graph showing a variation of a threshold voltage $V_{th}$ with respect to FN erase times of the first transistor 134 and the second transistor 136. As described above, the third P-typed impurity region 114 may be formed below the floating gate 130 included in the first transistor 134. The third P-typed impurity region 114 may not be formed below the floating gate 130 included in the second transistor 136. The threshold voltage $V_{th}-2$ of the second transistor 136 may be smaller than the threshold voltage $V_{th}-1$ of the first transistor 134 in an initial state. Electrons stored in the floating gates 130 included in the first and second transistors 134 and 136 may be removed using the Fowler Nordheim (FN) tunneling effect. An FN erase may be performed. Referring to FIG. 5, when the FN erase time increases, the threshold voltage $V_{th}-1$ of the first transistor 134 and the threshold voltage $V_{th}-2$ of the second transistor 136 may decrease. The threshold voltage $V_{th}-2$ of the second transistor 136 and the threshold voltage $V_{th}-1$ of the first transistor 134 may become negative and positive, respectively, by the FN erase.

When the threshold voltage $V_{th}-2$ of the second transistor 136 becomes negative, the second transistor 136 may be electrically changed into a depletion mode. A channel of the second transistor 136 may be formed. The second transistor 136 may maintain a turn-on state. The second transistor 136 may not have a substantial switching function. The second transistor 136 may operate as a conductive line. An operation characteristic of the second transistor 136 may be similar to the depletion transistor. The second transistor 136 may not be a depletion transistor because the N-typed impurity may not be doped below the floating gate 130 included in the second transistor 136.

Figure 6:
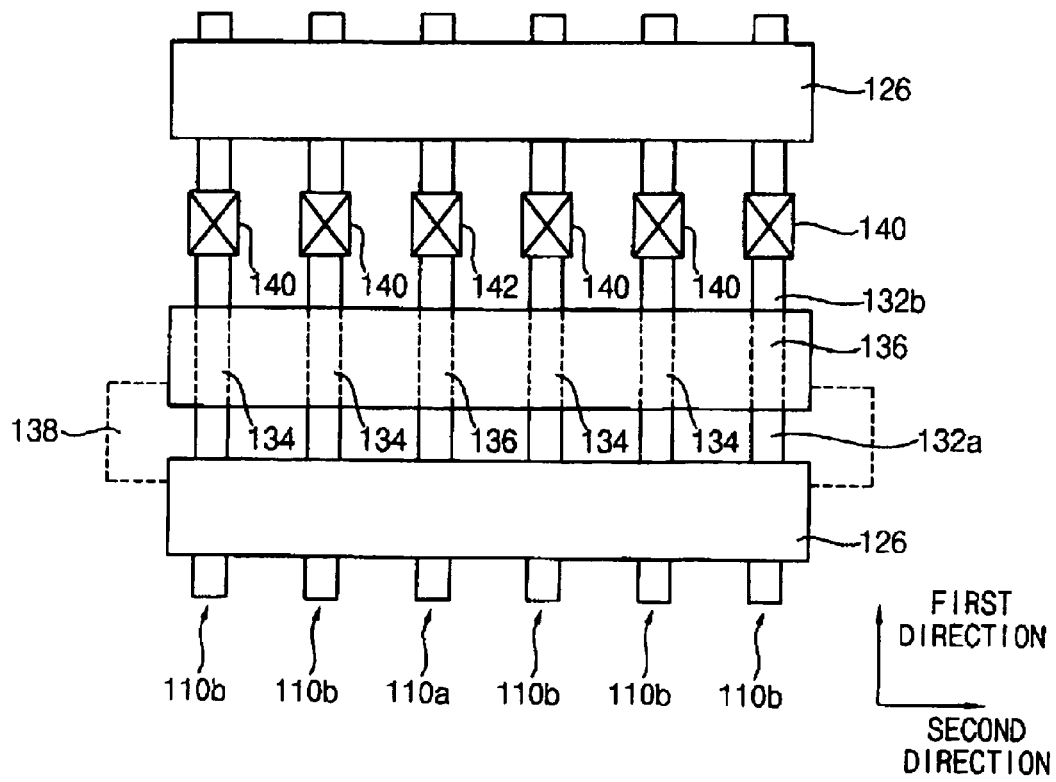

FIG. 6 is a plan view illustrating a source contact and a drain contact formed as a resultant in FIG. 2. Referring to FIG. 6, the N-typed source regions 132a may be electrically connected to one another by a common source line 138 extending in the second direction. The common source line 138 may extend in the second direction to enclose a side portion and a lower face of the isolation layer 108. A source contact 142 may be formed on the N-typed drain region 132b located on the first P-typed impurity region 110a. A drain contact 140 may be formed on the N-typed drain region 132b located on the second P-typed impurity region 110b.

As illustrated in FIG. 6, the second transistor 136 may be formed between the common source line 138 and the source contact 142. As described above, the second transistor 136 may always maintain the turn-on state. The common source line 138 and the source contact 142 may be electrically connected to each other with the aid of the second transistor 136 operating as the conductive line.

FIGS. 7 to 19 are partially cut perspective views illustrating a method of manufacturing the memory device in FIG. 3. Although FIGS. 7 to 19 illustrate a method of manufacturing a non-volatile memory device, e.g., a flash memory device, advantages of example embodiments may be employed in a method of manufacturing a volatile memory device, e.g., a DRAM device and/or an SRAM device.

Figure 7:
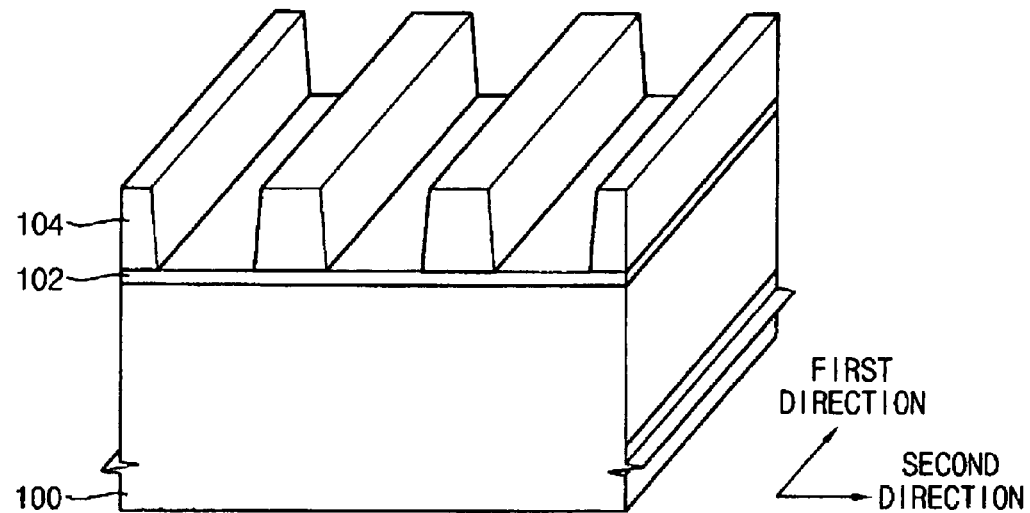
Figure 8:
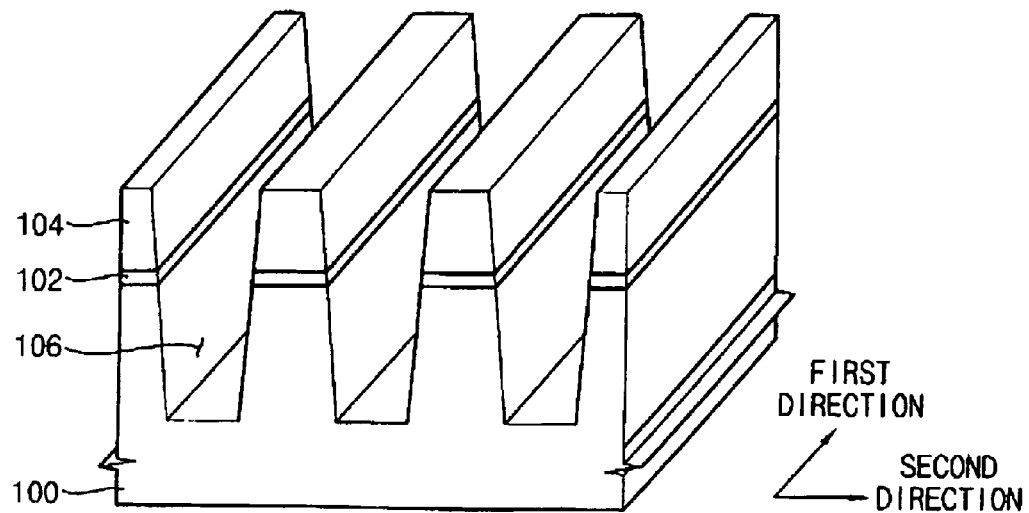

Referring to FIG. 7, a pad oxide layer 102 may be formed on a semiconductor substrate 100. Thereafter, mask layer patterns 104 extending in a first direction may be formed on the pad oxide layer 102. The mask layer patterns 104 may be spaced apart from one another in a second direction substantially perpendicular to the first direction. The mask layer patterns 104 may be formed using silicon nitride. The semiconductor substrate 100 may include P-typed impurities providing holes. The P-typed impurities may be boron (B), aluminum (Al), gallium (Ga) and/or indium (In). These may be used alone and/or in a combination thereof. Referring to FIG. 8, the pad oxide layer 102 and the semiconductor substrate 100 may be subsequently etched using the mask layer patterns 104 as an etching mask. A trench 106 may be formed at the semiconductor substrate 100.

Figure 9:
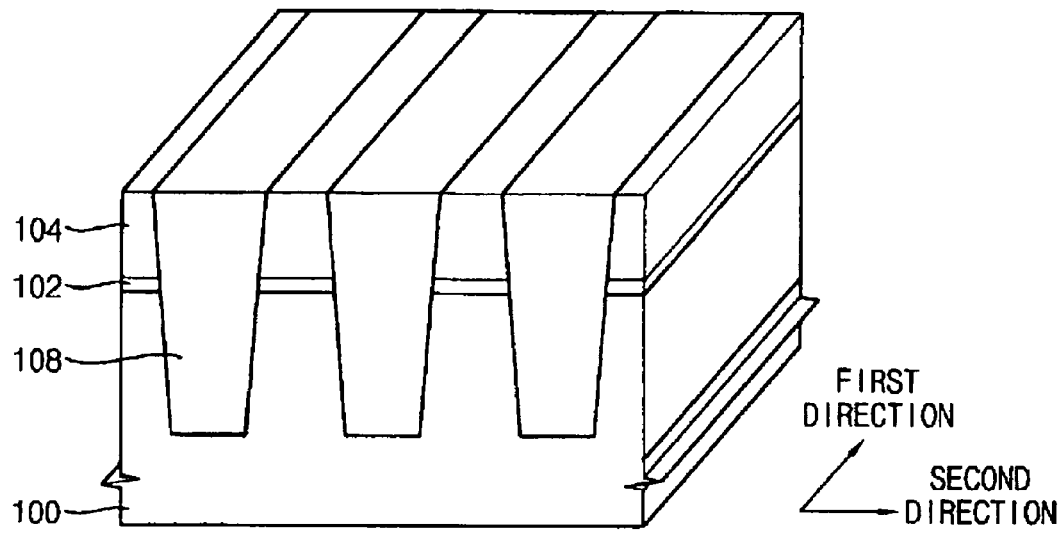

Referring to FIG. 9, an isolation layer 108 filling the trench 106 may be formed. An insulating layer (not shown) may be formed on the semiconductor substrate 100, the pad oxide layer 102 and the mask layer pattern 104 by using silicon oxide such that the insulating layer fills the trench 106. Thereafter, a chemical mechanical polishing process may be performed on the insulating layer until the mask layer pattern 104 is exposed. The isolation layer 108 may be formed.

Figure 10:
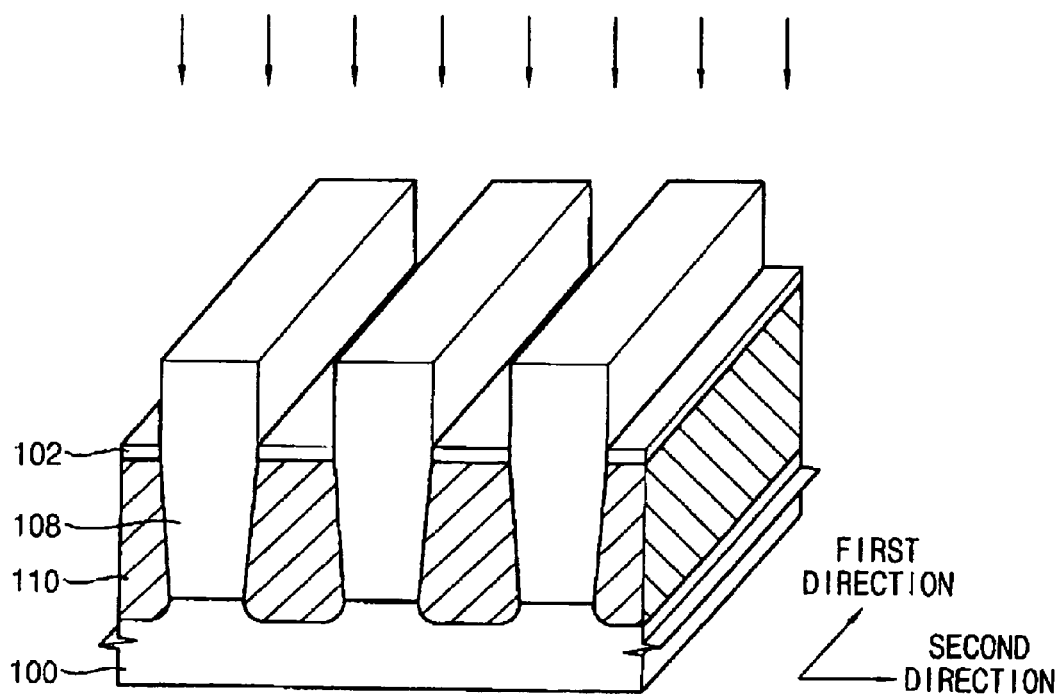

Referring to FIG. 10, the mask layer pattern 104 may be removed from the pad oxide layer 102 and the isolation layer 108. P-typed impurities may be then doped into the semiconductor substrate 100. P-typed impurity regions 110 may be formed at an upper portion of the semiconductor substrate 100. The P-typed impurity region 110 may prevent or reduce a punch-through effect. The P-typed impurity region 110 may prevent or reduce a current from flowing into an unexpected area due to a short channel effect.

An ion implantation process using boron may be employed to form the P-typed impurity region 110. When a voltage required for doping boron in the ion implantation process is substantially smaller than about 30 Kev, boron may be blocked by the pad oxide layer 102. Thus, boron may not be efficiently implanted into the semiconductor substrate 100. On the other hand, when the voltage required for doping boron in the ion implantation process may be substantially larger than about 300 Kev, the semiconductor substrate 100 may be damaged by an implantation of boron. As a result, the voltage required for doping boron in the ion implantation process may be about 20 Kev to about 300 Kev.

When a dose amount of boron in the ion implantation process is less than about $5\times10^{12}$ ions/$Cm^2$, an amount of boron implanted into the upper portion of the semiconductor substrate 100 may be relatively small. The P-typed impurity region 110 may not efficiently prevent or reduce the punch-through effect. When the dose amount of boron in the ion implantation process is greater than about $5\times10^{14}$ ions/$Cm^2$, the semiconductor substrate 100 may be damaged. The dose amount of boron in the ion implantation process may be about $5\times10^{12}$ ions/$Cm^2$ to about $5\times10^{14}$ ions/$Cm^2$.

Figure 11:
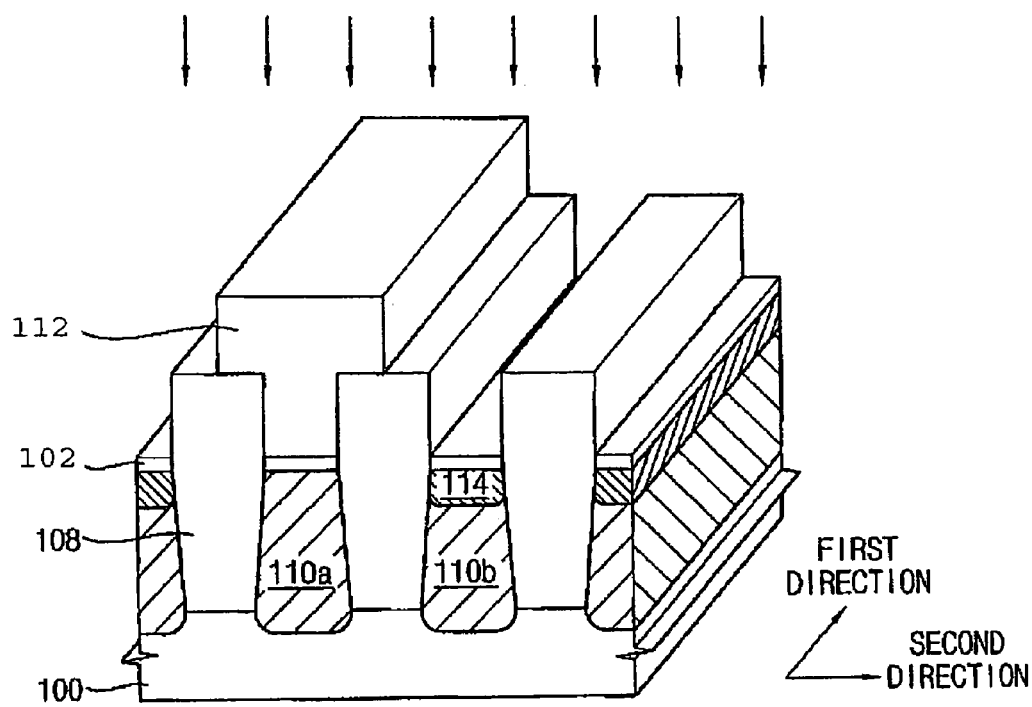

Referring to FIG. 11, the P-typed impurity regions 110 may include a first P-typed impurity region 110a on which a second transistor is to be formed and a second P-typed impurity region 110b on which a first transistor (e.g. a normal transistor) is to be formed. A photoresist pattern 112 may be formed on the first P-typed impurity region 110a by a photolithography process. Thereafter, P-typed impurities may be selectively implanted into the second P-typed impurity region 110b by using the photoresist pattern 112 as an ion implantation mask. A third P-typed impurity region 114 may be formed at a surface portion of the second P-typed impurity region 110b. The third P-typed impurity region 114 may operate to control a threshold voltage of the first transistor. The third P-typed impurity region 114 may have an impurity concentration substantially higher that that of the second P-typed impurity region 110b.

An ion implantation process using boron may be employed to form the third P-typed impurity region 114. When a voltage required for doping boron in the ion implantation process is substantially smaller than about 10 Kev, boron may be blocked by the pad oxide layer 102. Boron may not be efficiently implanted into the second P-typed impurity region 110b. The voltage required for doping boron in the ion implantation process may be substantially larger than about 50 Kev, and the second P-typed impurity region 110b may be damaged by an implantation of boron. As a result, the voltage required for doping boron in the ion implantation process may be about 10 Kev to about 50 Kev. When a dose amount of boron in the ion implantation process is less than about $5\times10^{12}$ ions/$Cm^2$, an amount of boron implanted into the second P-typed impurity region 110b may be relatively small.

The third P-typed impurity region 114 may not efficiently control the threshold voltage of the first transistor. When the dose amount of boron in the ion implantation process is greater than about $5\times10^{14}$ ions/$Cm^2$, the second P-typed impurity region 110b may be damaged. The dose amount of boron in the ion implantation process may be about $5\times10^{12}$ ions/$Cm^2$ to about $5\times10^{14}$ ions/$Cm^2$.

Figure 12:
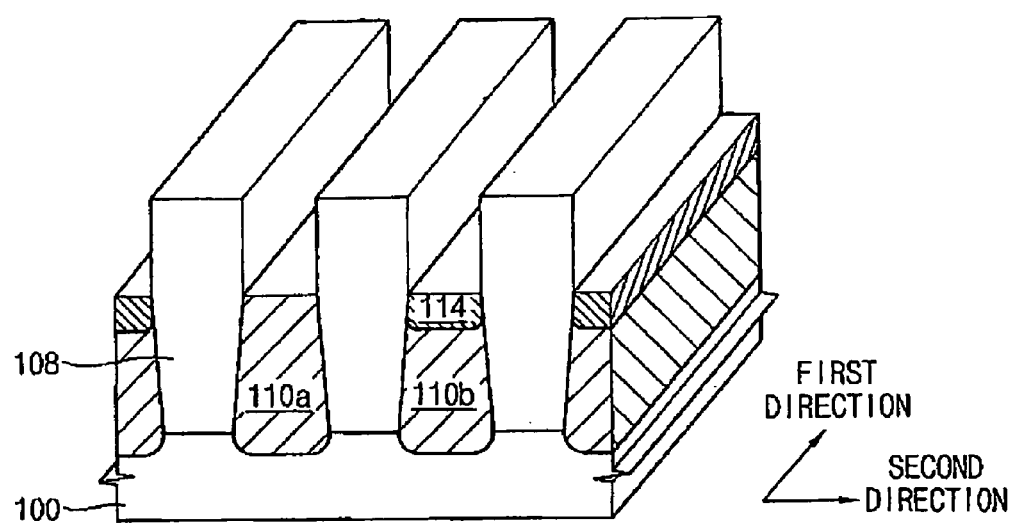
Figure 13:
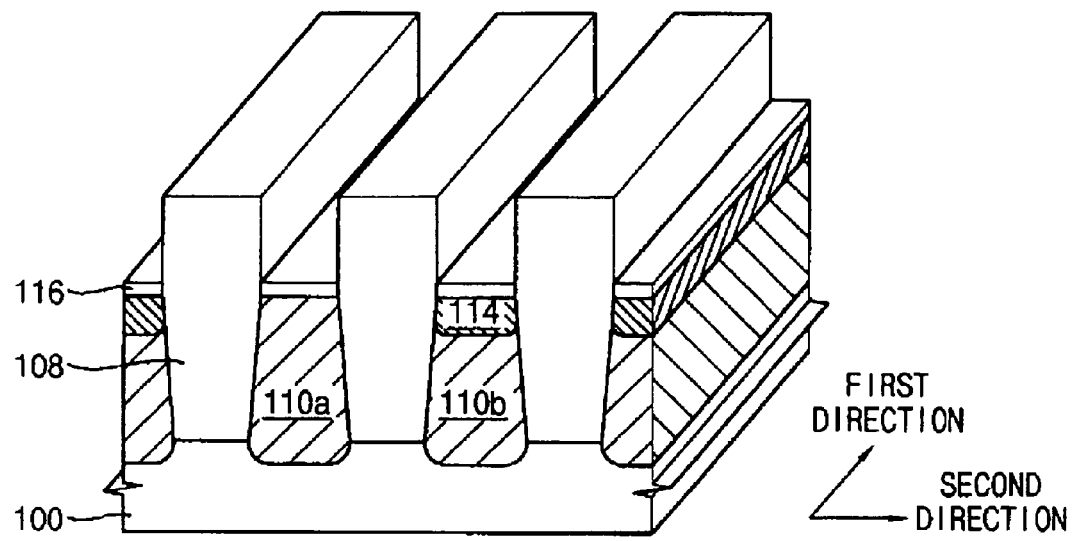

Referring to FIG. 12, the pad oxide layer 102 may be removed by a wet etching process. Although it is not illustrated in FIG. 7, the size of an exposed portion of the isolation layer 108 may be reduced when the pad oxide layer 102 is removed by the wet etching process. Referring to FIG. 13, a thermal oxidation process may be performed on the first P-typed impurity region 110a and the third P-typed impurity region 114 to form a tunnel oxide layer 116. When the tunnel oxide layer 116 is formed by the thermal oxidation process, the tunnel oxide layer 116 may be denser than an oxide layer formed by a chemical vapor deposition process.

Figure 14:
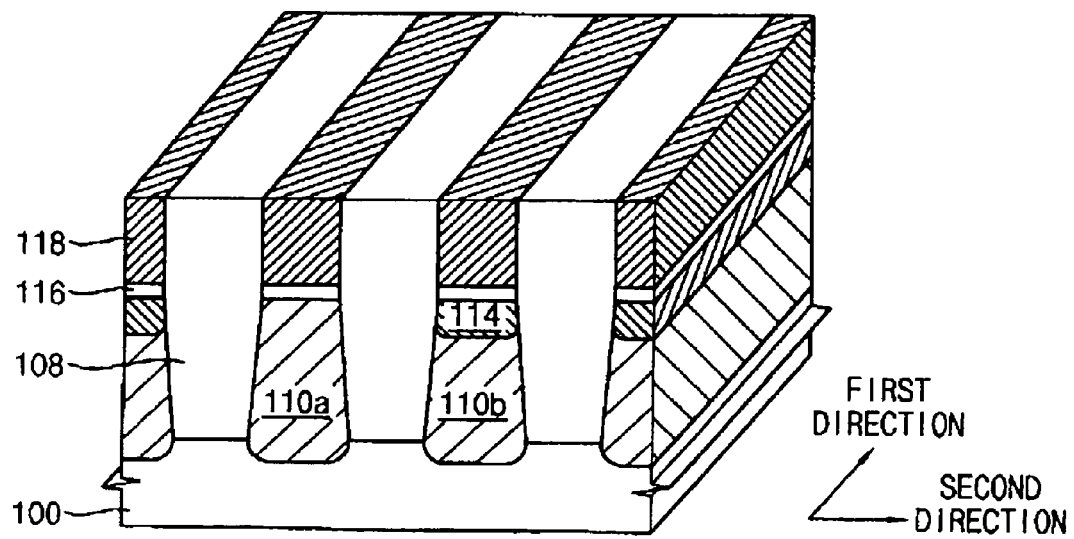
Figure 15:
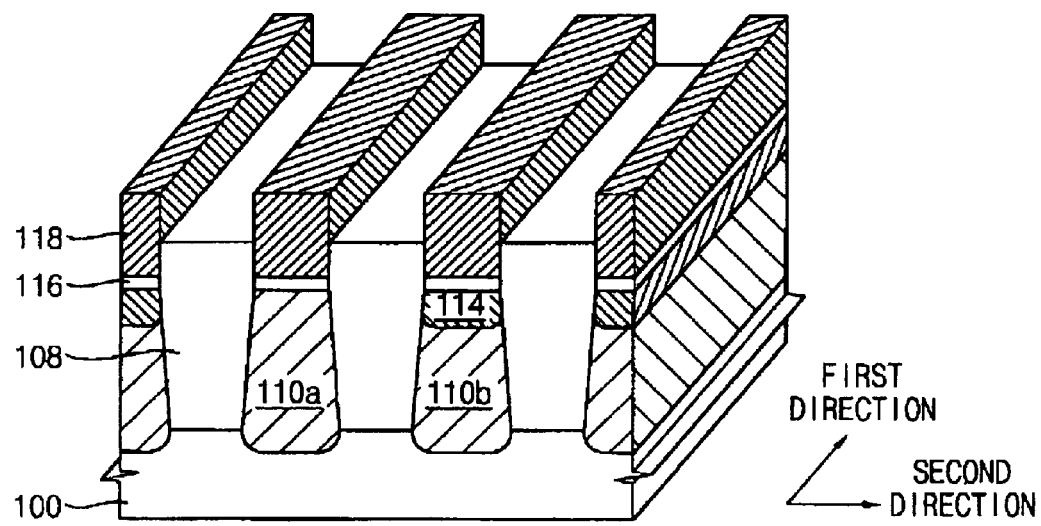

Referring to FIG. 14, a conductive layer may be formed on the tunnel oxide layer 116 and the isolation layer 108 by using a conductive material, e.g., doped polysilicon. Thereafter, the conductive layer may be planarized until the isolation layer 108 is exposed. A floating gate layer 118 may be formed. Referring to FIG. 15, an etching process may be performed on the isolation layer 108 to reduce the height of the isolation layer 108. An upper face of the isolation layer 108 may become lower than an upper face of the floating gate layer 118 after the etching process is performed.

Figure 16:
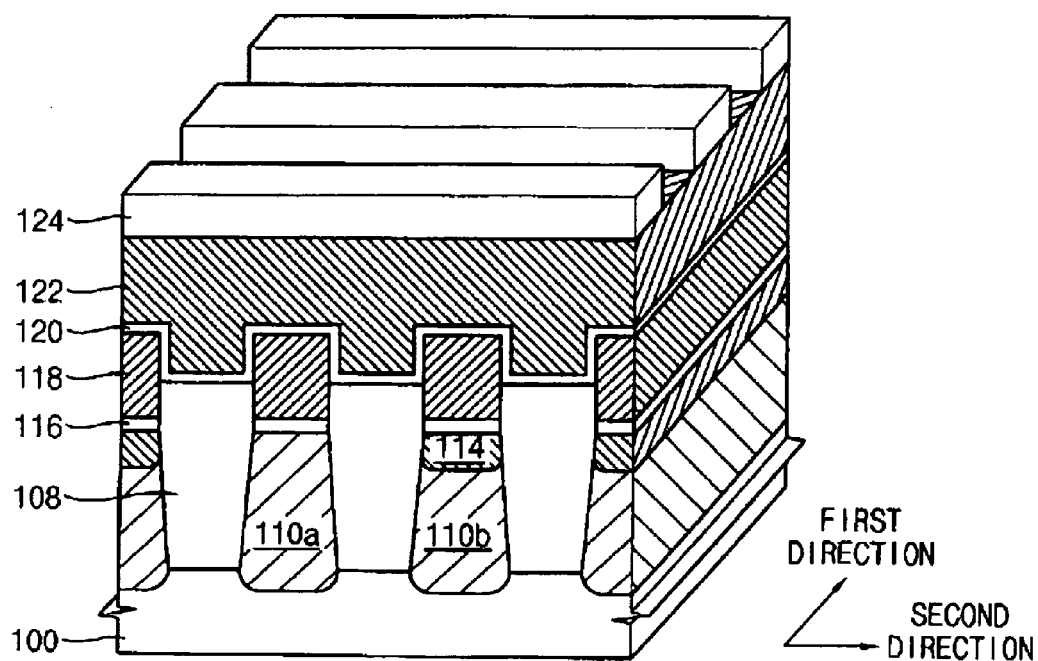

Referring to FIG. 16, an ONO layer 120 may be formed on the floating gate layer 118 and the isolation layer 108. The ONO layer 120 may include a silicon oxide layer, a silicon nitride layer and a silicon oxide layer. Thereafter, a control gate layer 122 may be formed on the ONO layer 120. The control gate layer 122 may be formed using a conductive material, e.g., doped polysilicon. Mask layer patterns 124 extending in the second direction may then be formed on the control gate layer 122. The mask layer patterns 124 may be spaced apart from one another in the first direction. The mask layer pattern 124 may include an insulating material, e.g., silicon nitride.

Figure 17:
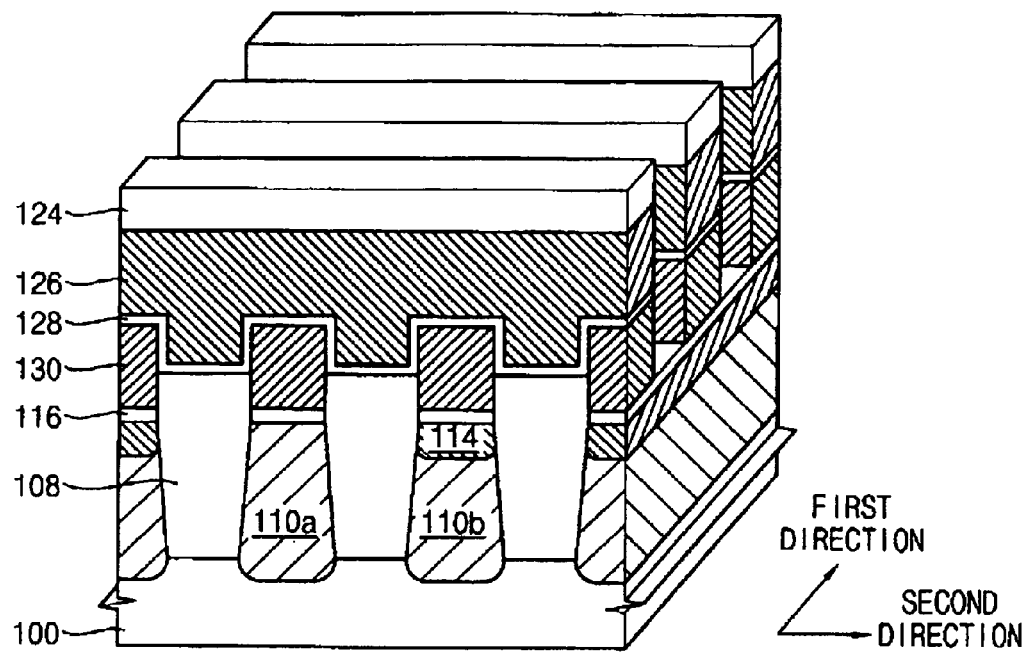

Referring to FIG. 17, the control gate layer 122, the ONO layer 120 and the floating gate layer 118 may be etched using the mask layer patterns 124 and an etching mask until the isolation layer 108 and the tunnel oxide layer 116 are exposed. The control gate layer 122, the ONO layer 120 and the floating gate layer 118 may be transformed into a control gate 126, an ONO layer pattern 128 and a floating gate 130. The floating gates 130 may be spaced apart from the first direction and the second direction. The ONO layer pattern 128 may extend in the second direction on the control gate 130 and the isolation layer 108. The control gate 126 may extend in the second direction on the ONO layer pattern 128.

Figure 18:
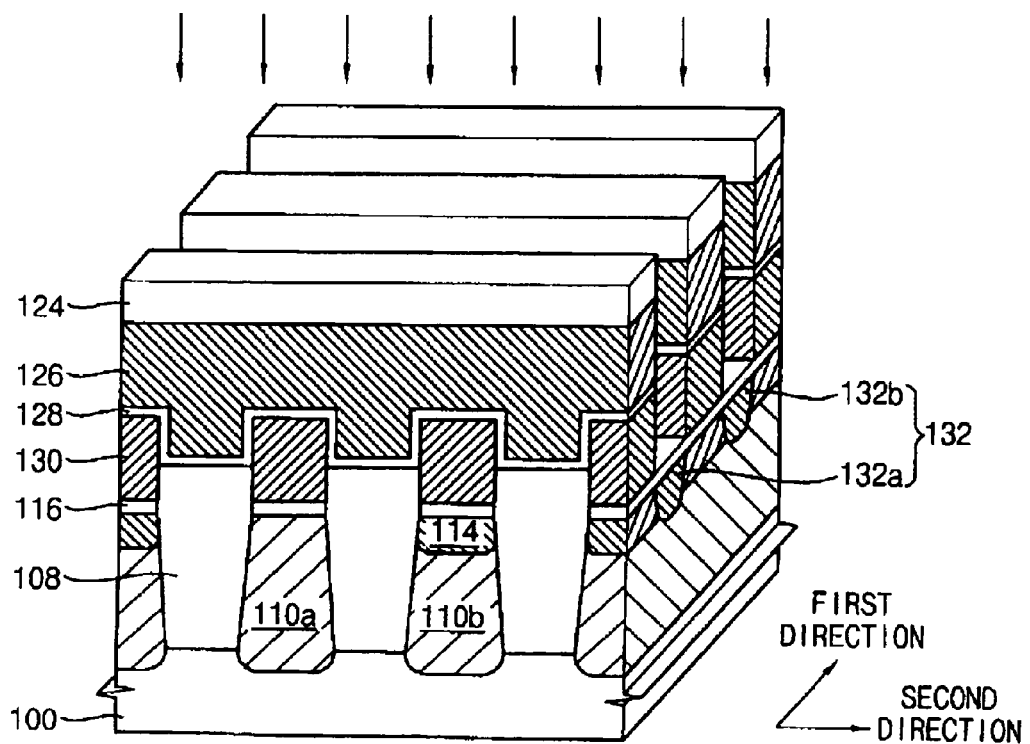

Referring to FIG. 18, N-typed impurities may be implanted into the first P-typed impurity region 110a and the second P-typed impurity region 110b by using the mask layer patterns 124 as an ion implantation mask. The N-typed impurities may be phosphorus (P), arsenic (As) and/or antimony (Sb). These may be used alone and/or in a combination thereof. N-typed impurity regions may be formed at surface portions of the first P-typed impurity region 110a and the second P-typed impurity region 110b. The N-typed impurity region 132 may include a source region 132a formed below one side of the floating gate 130 and a drain region formed below the other side of the floating gate 130. The source regions 132a and the drain regions 132b may be arranged in the second direction. The source region 132a and the drain region 132b may be alternately arranged in the first direction.

Figure 19:
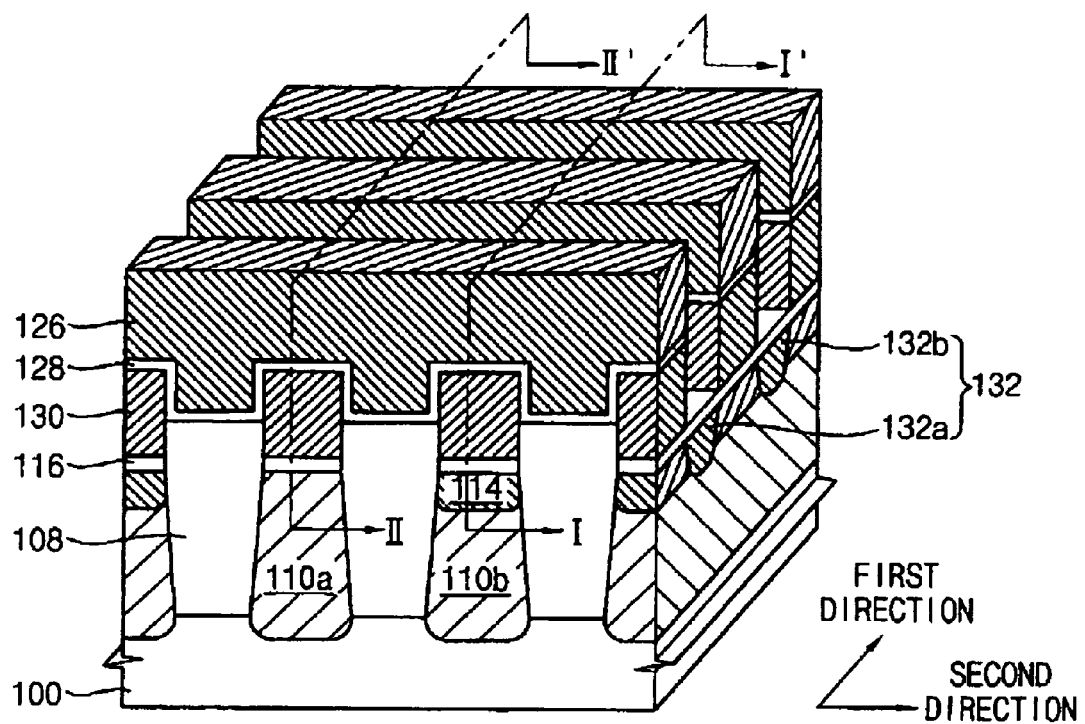

Referring to FIG. 19, the mask layer patterns 124 may be removed from the control gate 126. The mask layer patterns 124 may be removed from the control gate 126 by a wet etching process.

Figure 20:
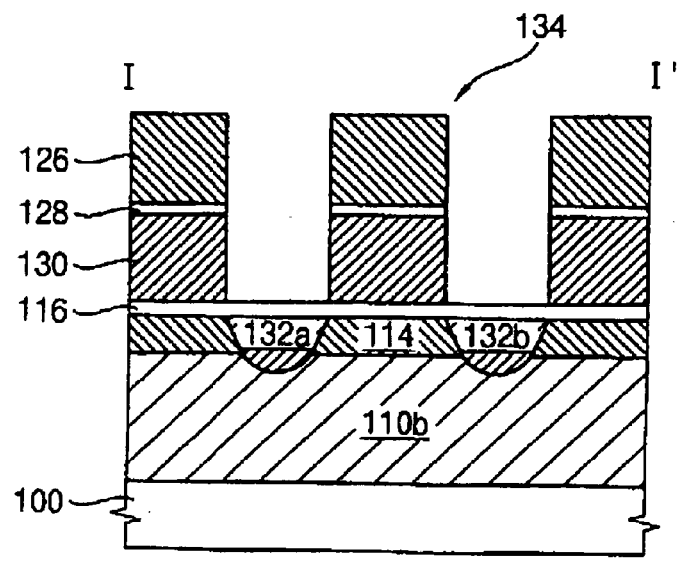

FIG. 20 is a cross-sectional view taken along a line I-I' in FIG. 19. Referring to FIG. 20, a first transistor 134 may be formed. The first transistor 134 may include the third P-typed impurity region 114 formed at an upper portion of the second P-typed impurity region 110b; the source region 132a formed at one side of the third P-typed impurity region 114; the drain region 132b formed at the other side of the third P-typed impurity region 114; the tunnel oxide layer 116 formed on the third P-typed impurity region 114; the floating gate 130 formed on the tunnel oxide layer 116; an ONO layer pattern 128 formed on the floating gate 130; and a control gate 126 formed on the ONO layer pattern 128.

Figure 21:
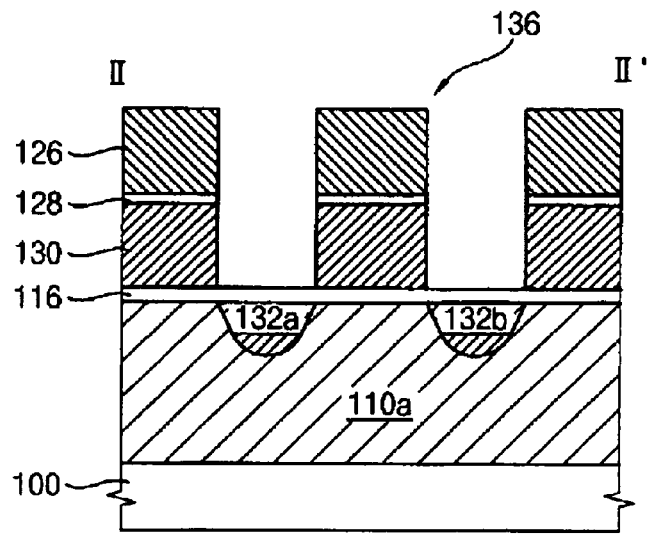

FIG. 21 is a cross-sectional view taken along a line II-II' in FIG. 19. Referring to FIG. 21, a second transistor 136 may be formed. The second transistor 136 may be similar to the first transistor 134 except that the third P-typed impurity region 114 is not formed below the floating gate 130. The second transistor 136 may include the source region 132a, the drain region 132b; a surface portion of the P-typed impurity region 110a located between the source region 132a and the drain region 132b; the tunnel oxide layer 116 formed on the surface portion of the first P-typed impurity region 110a; the floating gate 130 formed on the tunnel oxide layer; the ONO layer pattern 128 formed on the floating gate 130; and the control gate 126 formed on the ONO layer pattern 128.

Figure 22:
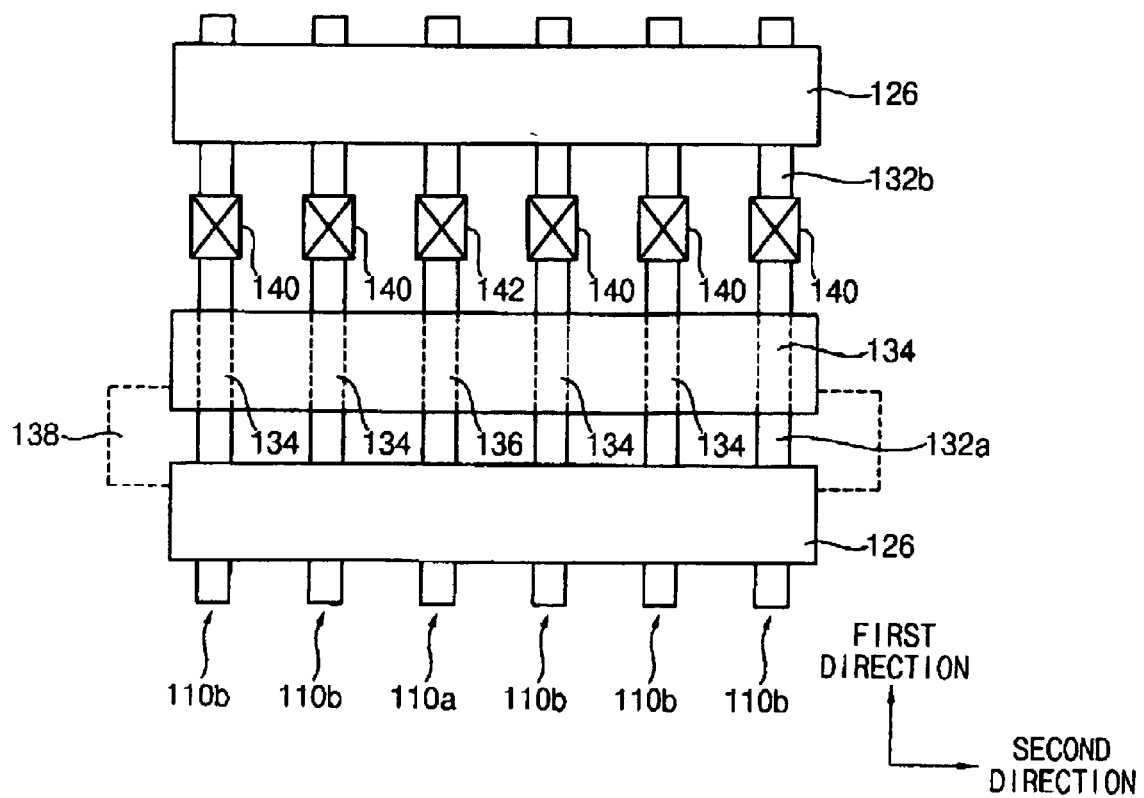

FIG. 22 is a plan view illustrating a formation of a source contact and a drain contact on a resultant in FIG. 19. Referring to FIG. 6, the N-typed source regions 132a may be electrically connected to one another by a common source line 138 extending in the second direction. The common source line 138 may extend in the second direction to enclose a side portion and a lower face of the isolation layer 108. A conventional method of forming a common source line 138 inside the semiconductor substrate 100 may be used. A drain contact 140 may be formed on the N-typed drain region 132b located on the second P-typed impurity region 110b. A source contract 142 may be formed on the N-typed drain region 132b located on the first P-typed impurity region 110a.

As illustrated in FIG. 22, the second transistor 136 may be formed between the common source line 138 and the source contact 142. As described above, the second transistor 136 may maintain the turn-on state. The common source line 138 and the source contact 142 may be electrically connected to each other with the aid of the second transistor 136 operating as the conductive line. In FIG. 22, there may be one first P-typed impurity region 110a formed between the second P-typed impurity regions 110b. At least two first P-typed impurity regions 110a may be formed between the second P-typed impurity regions 110b.

As explained with reference to FIG. 5, it may be required that a threshold voltage $V_{th}$-1 of the first transistor 134 and a threshold voltage $V_{th}$-2 of the second transistor 136 are kept positive and negative, respectively, for operating a memory device. An FN ease may be required to remove electrons form the floating gate 130 after the first transistor 134 and the second transistor 136 are formed.

According to example embodiments, a source contact may be formed at a drain region instead of a common source line so that an integration degree of a memory device may be efficiently improved. A control gate may be linearly formed in a second direction, thereby to prevent or reduce a deterioration of an operation characteristic due to a coupling effect generated between curved control gates. Furthermore, a memory device of example embodiments may not employ a depletion transistor. An additional photolithography process and an additional ion implantation process required for forming the depletion transistor may not be required, and thus processes may be simplified.

The foregoing is illustrative of example embodiments and is not to be construed as limiting thereof. Although a few example embodiments have been described, those skilled in the art will readily appreciate that many modifications are possible in the embodiments without materially departing from the novel teachings and advantages of example embodiments. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A memory device comprising:
a first transistor including a first source region, a first drain region and a first channel region between the first source region and the first drain region, the first channel region being doped with a P-typed impurity having a first concentration;
a second transistor including a second source region, a second drain region and a second channel region, the second channel region being doped with a P-typed impurity having a second concentration, the second concentration being substantially lower than the first concentration;
a common source extending in a first direction, wherein the common source electrically connects the first source region and the second source region;
a drain contact on the first drain region; and
a source contact on the second drain region, wherein the first and second concentrations are substantially uniform concentrations in a lateral direction perpendicular to the substrate.

2. The memory device of claim 1, wherein the first transistor includes a tunnel oxide layer on the first channel region, a floating gate on the tunnel oxide layer, an ONO layer pattern extending in the first direction on the floating gate and a control gate extending in the first direction on the ONO layer pattern.

3. The memory device of claim 1, wherein the second transistor includes a tunnel oxide layer on the second channel region, a floating gate on the tunnel oxide layer, an ONO layer pattern extending in the first direction on the floating gate and a control gate extending in the first direction on the ONO layer pattern.

4. The memory device of claim 1, wherein the first source region, the first channel region and the first drain region are formed at an upper portion of a second P-typed impurity region extending in a second direction substantially perpendicular to the first direction;
wherein the second source region, the second channel region and the second drain region are formed at an upper portion of a first P-typed impurity region extending in the second direction, the first P-typed impurity region having the same P-typed impurity concentration as the second P-typed impurity region;
wherein the first channel region corresponds to a third P-typed impurity region formed at a surface portion of the second P-typed impurity region, a P-typed impurity concentration of the third P-typed impurity region being higher than a P-typed impurity concentration of the second channel region; and
wherein the second channel region corresponds to a surface portion of the first P-typed impurity region.

5. The memory device of claim 1, wherein the second concentration of the second channel region is about 25% to about 50% of the first concentration of the first channel region.

6. The memory device of claim 1, wherein a threshold voltage of the first transistor and a threshold voltage of the second transistor are positive and negative, respectively.

7. The memory device of claim 1, wherein the first source region, the second source region, the first drain region and the second drain region are doped with an N-typed impurity.

8. The memory device of claim 1, wherein the source contact and the drain contact are linearly arranged in the first direction.

9. The memory device of claim 1, wherein the second channel region is configured to electrically connect the source contact to the common source.

* * * * *